United States Patent
Gupta et al.

(10) Patent No.: US 6,231,707 B1
(45) Date of Patent: May 15, 2001

(54) METHOD OF FORMING A MULTILAYER CERAMIC SUBSTRATE WITH MAX-PUNCHED VIAS

(75) Inventors: Dinesh Gupta; L. Wynn Herron; John U. Knickerbocker, all of Hopewell Junction; David C. Long, Wappingers Falls; Jawahar P. Nayak, Wappingers Falls; Robert A. Rita, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/158,615

(22) Filed: Sep. 22, 1998

(51) Int. Cl.$^7$ ....................................... B32B 31/26
(52) U.S. Cl. ..................... 156/89.12; 156/252; 264/610
(58) Field of Search .................. 156/89.12, 89.16, 156/89.17, 89.18, 89.19, 89.21, 89.23, 252, 256; 264/614, 610, 619; 29/851; 427/96, 97

(56) References Cited

U.S. PATENT DOCUMENTS

| | | |
|---|---|---|
| 4,234,367 | 11/1980 | Herron et al. ........................ 156/89 |
| 4,302,625 | 11/1981 | Hetherington et al. ............. 174/68.5 |
| 4,425,829 | 1/1984 | Kranik et al. ........................ 83/62.1 |
| 4,799,984 | 1/1989 | Rellick .................................. 156/89 |
| 4,821,614 | 4/1989 | Fleet et al. ............................ 83/100 |
| 5,302,219 | 4/1994 | Hargis .................................. 156/89 |
| 5,354,599 | * 10/1994 | McClanahan et al. . |
| 5,360,948 | 11/1994 | Thornberg ........................... 174/263 |

* cited by examiner

Primary Examiner—Curtis Mayes
(74) Attorney, Agent, or Firm—Ira D. Blecker

(57) ABSTRACT

In the formation of multilayer ceramic substrates, greensheets are utilized which have the same pattern and number of vias punched in each greensheet. Then, selected vias may be filled with metallic paste to form the internal connections of the multilayer ceramic substrate. The remaining vias may be filled with a fugitive material or left totally unfilled. Also disclosed is the multilayer ceramic substrate produced by this method.

5 Claims, 3 Drawing Sheets

METHOD OF FORMING A MULTILAYER CERAMIC SUBSTRATE WITH MAX-PUNCHED VIAS

BACKGROUND OF THE INVENTION

The present invention relates to multilayer ceramic substrates and a method for forming same, and more particularly, relates to multilayer ceramic substrates, and a method for forming same, having multiple layers with the same number and pattern of vias with some of the vias being electrically conducting and the remainder being non-electrically conducting.

Ceramic packages for supporting semiconductor devices and the like are comprised of a ceramic substrate with printed conductive stripes connected to the device and to input/output pins or other connections with are joined to boards or the like. While many techniques are known for forming such ceramic substrates, one of the most popular procedures for such fabrication involves the casting of what is termed a ceramic greensheet, stacking it with other ceramic greensheets and the subsequent processing and firing of the stack of ceramic greensheets. The method of producing such multilayer ceramic (hereafter MLC) substrates for semiconductor packaging and other electronics applications is well known as illustrated in Herron et al. U.S. Pat. No. 4,234,367, Hetherington et al. U.S. Pat. No 4,302,625, and Rellick U.S. Pat. No. 4,799,984, the disclosures of which are incorporated by reference herein.

In this MLC substrate technology, greensheets of ceramic powder held together in sheet form by a suitable aqueous or organic binder are punched to form via holes in a predefined pattern, the via holes subsequently filled with a conductive paste, and metallurgy lines formed on the surface of the greensheet by screening or extrusion printing. The conductive paste is formed of a suitable metallic material which will withstand the subsequent sintering process. The metallized sheets are stacked, laminated and fired in an appropriate atmosphere to form a monolithic MLC substrate with a complex internal circuitry.

It is convenient to punch the via holes with a tool of the type disclosed in Kranik et al. U.S. Pat. No. 4,425,829, the disclosure of which is incorporated by reference herein, where a so-called "gang punch" tool may be utilized where a punch die and accompanying punches cooperate to punch greensheets at desired locations. Alternatively, as disclosed in Fleet et al. U.S. Pat. No. 4,821,614, the disclosure of which is incorporated by reference herein, the punch tool is programmable and punches vias at desired locations.

In the traditional method of building MLC substrates as disclosed in the above patents, each layer has a unique via pattern so the punch tool may be programmable in order to punch each individual layer. Alternatively, each layer may be gang punched but this requires a separate punch die and punches for each layer.

Using a programmable punch tool to punch each layer is flexible but slow so that many programmable punch tools are needed in a manufacturing environment to handle the expected large number of greensheets to be punched. Gang punching the greensheets is fast but to build a separate punch die and punches for each separate layer is expensive.

Accordingly, a new way of handling the punching of greensheets is desired.

Hargis U.S. Pat. No. 5,302,219, the disclosure of which is incorporated by reference herein, discloses forming the same pattern of vias in each of a plurality of greensheets and then filling some of the vias with metallic paste and the remainder with non-conductive (e.g., ceramic) paste. Filling the remaining vias with the non-conductive paste represents a costly, second screening step.

Thornberg U.S. Pat. No. 5,360,948, the disclosure of which is incorporated by reference herein, discloses a programmable substrate where thin film signal layers are formed and then vias are formed down to the signal layers. The vias may then be filled with metallic material or may be left unfilled as desired. The filled vias may then be connected on the surface in a desired manner to form a programmable substrate. This reference is directed to connecting vias on the surface of the substrate and is not meant to connect the vias within the interior of the substrate.

Thus, a purpose of the present invention is to have a new method for the forming of vias in greensheets where only selected vias in a greensheet are in electrical contact with vias in another greensheet.

BRIEF SUMMARY OF THE INVENTION

A first aspect of the invention relates to a method of forming a multilayer ceramic substrate, the method comprising the steps of:

obtaining a plurality of greensheets, each of the greensheets comprising a binder material and ceramic particles;

punching a plurality of vias in each of the greensheets, the pattern and number of vias in each of the greensheets being the same, the plurality of vias in each of the greensheets consisting of a first plurality of vias and a second plurality of vias;

filling the first plurality of vias in each of the greensheets with an electrically conducting paste;

avoiding the filling of the second plurality of vias in each of the greensheets with a paste comprising metallic or ceramic particles;

optionally filling at least some of the second plurality of vias in at least one of the greensheets with a fugitive material;

stacking the plurality of greensheets in a predetermined order to form an unsintered multilayer ceramic substrate; and sintering the unsintered multilayer ceramic substrate, wherein the binder material and fugitive material are removed, thereby resulting in a sintered multilayer ceramic substrate.

A second aspect of the invention relates to a multilayer ceramic substrate comprising:

a first layer having a first plurality of vias being filled with electrically conducting material and a second plurality of vias being devoid of any material;

second layer, adjacent to the first layer, having a first plurality of vias being filled with electrically conducting material and a second plurality of vias being devoid of any material;

wherein at least some of the first plurality of vias and the second plurality of vias, respectively, in the first layer being in alignment with at least some of the first plurality of vias and the second plurality of vias in the second layer.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
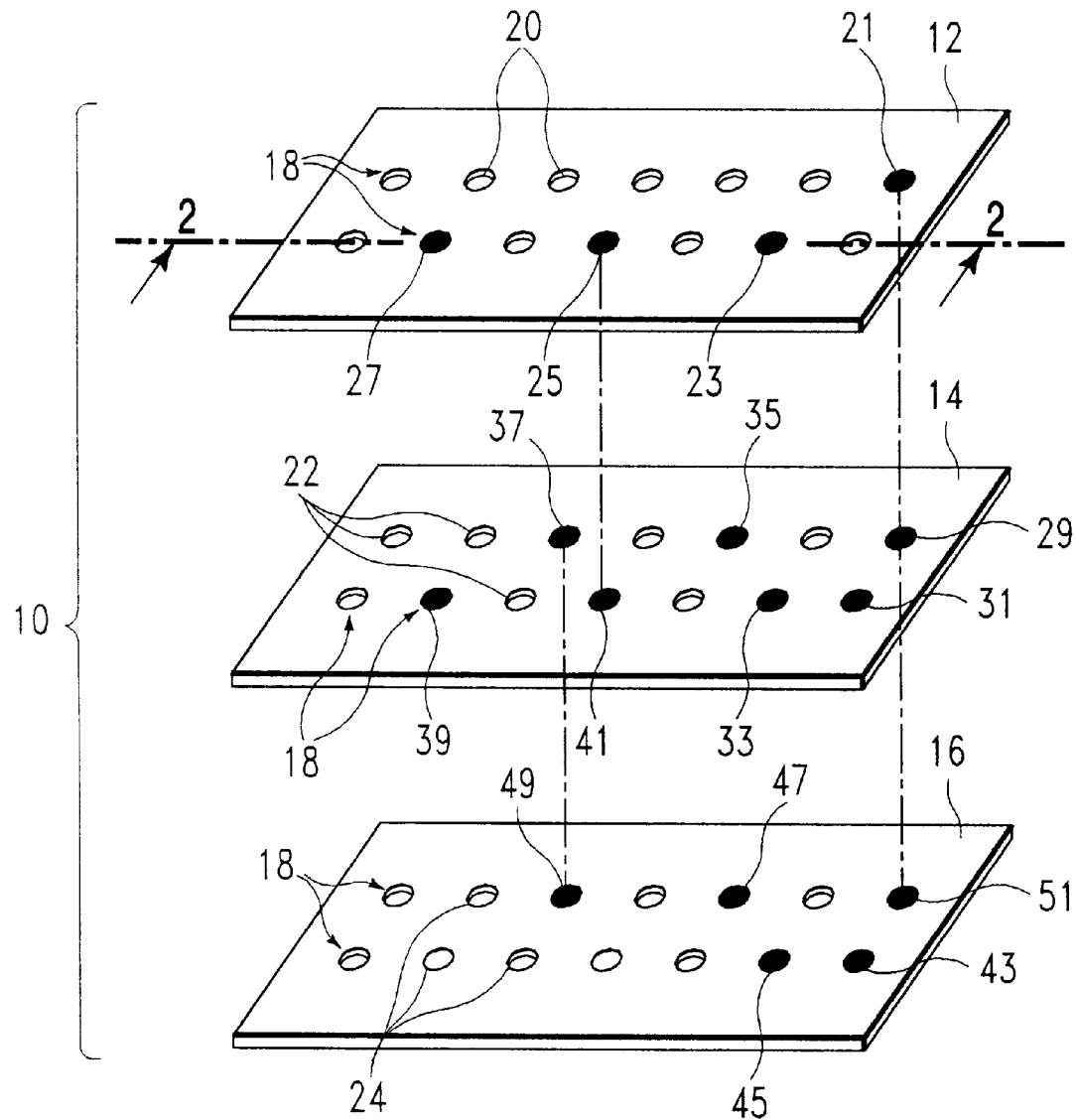
FIG. 1 is an exploded perspective view of a first embodiment of an MLC substrate prior to sintering produced according to the present invention.

Referring to the Figures in more detail, and particularly referring to FIG. 1, there is disclosed unsintered MLC substrate 10 comprising a plurality of greensheets 12, 14, 16. As shown in FIG. 1 there are three greensheets but as can be appreciated by those skilled in the art there may be more or less than three greensheets to actually form an MLC substrate. Each greensheet comprises ceramic particles in a binder matrix as is well known to those skilled in the art. The binder material comprising the binder matrix may be an organic-based or aqueous-based material and may also contain conventional plasticizers and rheological control agents.

One of the greensheets, for example greensheet 12, is designed so as to have the right vias for connection to a semiconductor device (not shown) while another of the greensheets, for example greensheet 16, is designed so to have the right vias for connection to the next level of packaging (not shown).

Each of greensheets 12, 14, 16 have been punched by conventional means to form vias, generally indicated by 18, as shown in FIG. 1. It is to be noted that each of the greensheets has the same pattern and number of vias. In actual practice, each of greensheets 12, 14, 16 would also have a plurality of wiring lines to connect various vias for redistribution within the MLC substrate. Such wiring lines are removed for the sake of clarity.

It is not necessary for each via 18 on each greensheet to connect with a via on an adjacent greensheet. Thus, some vias may be electrically conducting while other vias need not be. Due to the universal nature of the punched greensheets according to the present invention, some vias may in fact be redundant for a particular application. A first plurality of vias 21, 23, 25, 27 in greensheet 12 have been filled with a metallic paste and so are electrically conducting. The remaining plurality of vias 20 in greensheet 12 are chosen to be non-electrically conducting. Similarly, in greensheet 14, vias 29, 31, 33, 35, 37, 39, 41 are electrically conducting while vias 43, 45, 47, 49, 51 in greensheet 16 are electrically conducting. The remaining vias 22, 24 in each of greensheets 14, 16, respectively, are selected to be non-electrically conducting.

By appropriately selecting vias, the desired electrical connections between the various greensheets can be made. For example, via 21 in greensheet 12 may be connected with via 29 in greensheet 14 and then with via 51 in greensheet 16 so that a connection between all three greensheets may be made. This connection (and other similar connections) are shown by dashed lines. A connection between greensheet 12 and greensheet 14 may be accomplished through respective vias 25, 41. A connection between greensheet 14 and greensheet 16 may be accomplished through respective vias 37, 49.

Once the selected vias have been filled with metallic paste, and the remaining vias have been protected by appropriate masking from receiving the metallic paste, the greensheets may be stacked in the desired order, laminated if desired and then sintered according to conventional practice. Once stacked and sintered, at least some of the first plurality of vias (being electrically conducting) in one layer are in alignment with the first plurality of vias (being electrically conducting) in an adjacent layer. Similarly, at least some of the second plurality of vias (being non-electrically conducting) in one layer are in alignment with the second plurality of vias (being non-electrically conducting) in an adjacent layer.

Figure 2:
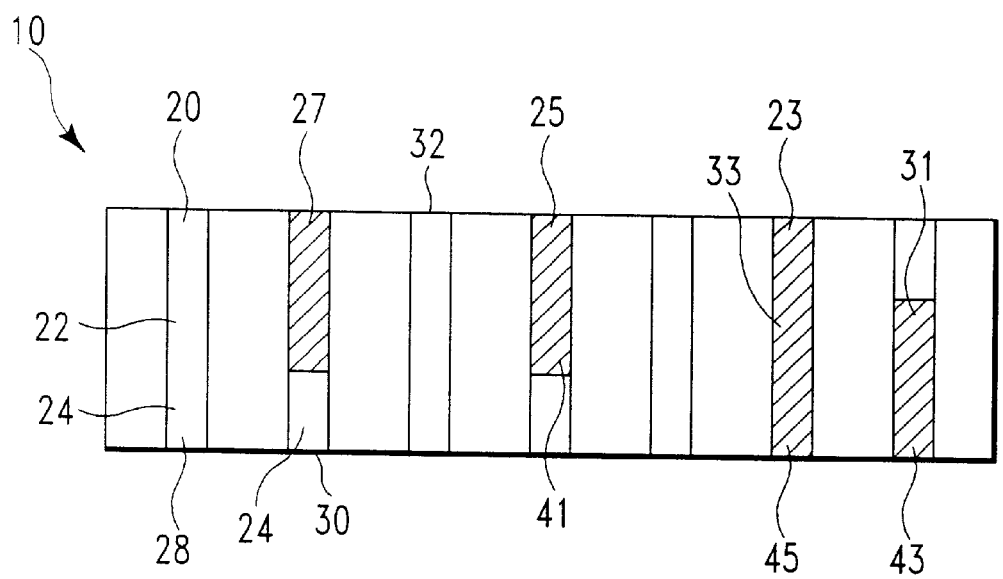
FIG. 2 is a cross-sectional view of the MLC substrate of FIG. 1, after sintering, in the direction of arrows II—II of FIG. 1.

Referring now to FIG. 2, there is shown MLC substrate 10 after sintering. In via column 28, non-electrically conducting vias 20, 22, 24 are in alignment. In via column 30, electrically conducting vias 27, 39 are in alignment with each other and with non-electrically conducting via 24. Similar via relationships hold for the remainder of the via columns.

Generally speaking, a particular advantage of the present invention is flexibility as no two adjacent greensheets will have the same pattern of filled and unfilled vias.

The greensheet vias that do not contain the metallic paste, i.e., those that are non-electrically conducting, may be left unfilled. Depending on variables due to stacking, laminating and sintering, such unfilled vias may collapse. Accordingly, it may be desirable to fill some or all of such vias with a fugitive paste, such as a paste that comprises the same material as the binder material of the greensheet. By fugitive, it is meant that the paste burns off during sintering, leaving no residue. As shown in FIG. 2, via column 28 is unfilled while via column 32 had been filled with fugitive material but is now unfilled.

Figure 3:
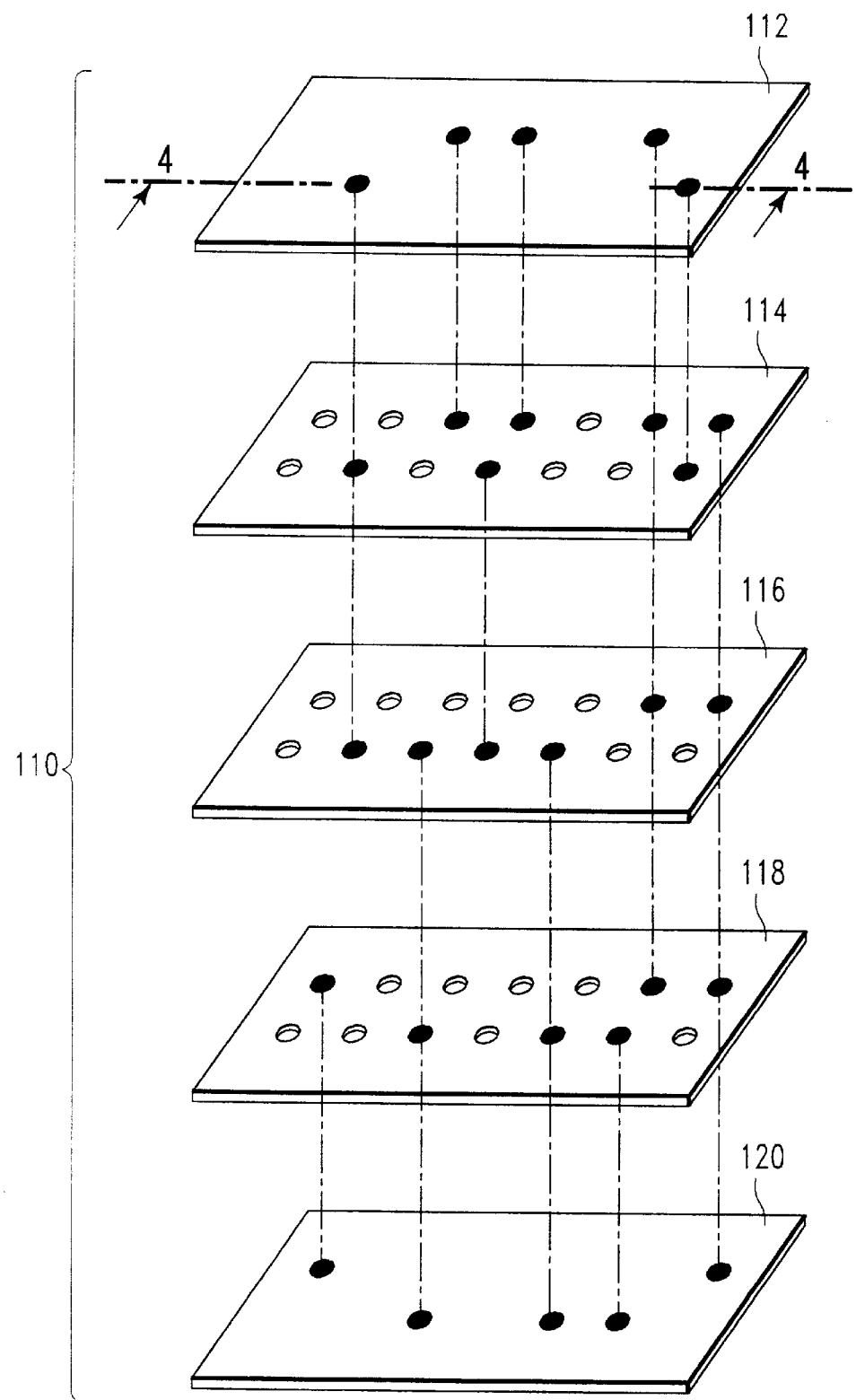
FIG. 3 is an exploded perspective view of a second embodiment of an MLC substrate prior to sintering produced according to the present invention.

Referring to FIG. 3 now, there is disclosed a second embodiment of the present invention. Multilayer ceramic substrate 110 consists of greensheets 112, 114, 116, 118, 120. Greesheets 114, 116, 118 are similar to those discussed with respect to the first embodiment of the invention in that each of these greensheets 114, 116, 118 have the same pattern and number of vias. What makes the embodiment of FIG. 3 different is that greensheets 112, 120 only have filled vias, thus each of greensheets 112, 120 are custom punched to fit the particular need of the designed MLC substrate. It may be desirable to design greensheets 112, 120 in this manner so that there are no extraneous vias which may interfere with the joining of a semiconductor device (not shown) to greensheet 112 or with the joining of greensheet 120 to the next level of packaging (not shown). Additionally, and perhaps more importantly greensheets 112, 120 provide hermeticity to the substrate 10.

Figure 4:
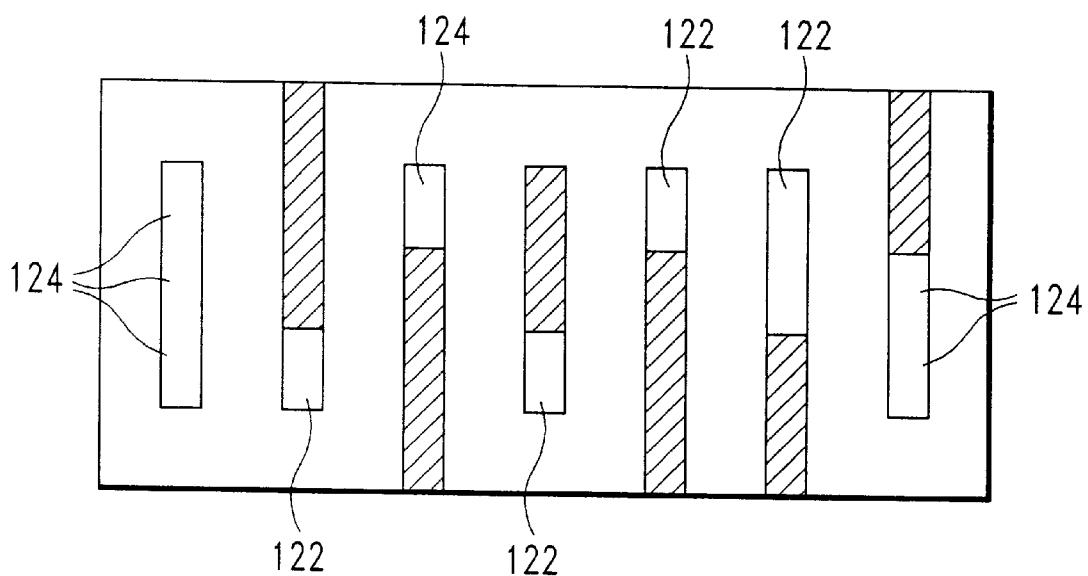
FIG. 4 is a cross-sectional view of the MLC substrate of FIG. 3, after sintering, in the direction of arrows IV—IV of FIG. 3.

FIG. 4 shows MLC substrate 10 after sintering. Similar to FIG. 2, the non-electrically conducting vias are devoid of material, such as vias 122, or had been filled with a fugitive material but are now unfilled, such as vias 124.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of forming a multilayer ceramic substrate, the method comprising the steps of:
   obtaining a plurality of greensheets, each of the greensheets comprising a binder material and ceramic particles;
   punching a plurality of vias in each of the greensheets, the pattern and number of vias in each of the greensheets being the same, the plurality of vias in each of the greensheets consisting of a first plurality of vias and a second plurality of vias;
   filling the first plurality of vias in each of the greensheets with an electrically conducting paste;
   avoiding the filling of the second plurality of vias in each of the greensheets with a paste comprising metallic or ceramic particles;
   filling at least some of the second plurality of vias in at least one of the greensheets with a fugitive material;
   stacking the plurality of greensheets in a predetermined order to form an unsintered multilayer ceramic substrate; and
   sintering the unsintered multilayer ceramic substrate, wherein the binder material and fugitive material are removed, thereby resulting in a sintered multilayer ceramic substrate.

2. The method of claim 1 wherein no two adjacent greensheets have the same pattern of filled and unfilled vias.

3. The method of claim 1 wherein the fugitive material comprises a binder material and no ceramic or metallic particles.

4. The method of claim 3 wherein the binder material is the same as that comprising the greensheets.

5. A method of forming a multilayer ceramic substrate, the method comprising the steps of:
   obtaining a plurality of greensheets, each of the greensheets comprising a binder material and ceramic particles;
   punching a plurality of vias in each of the greensheets, the pattern and number of vias in each of the greensheets being the same, the plurality of vias in each of the greensheets consisting of a first plurality of vias and a second plurality of vias;
   filling the first plurality of vias in each of the greensheets with an electrically conducting paste;
   avoiding the filling of the second plurality of vias in each of the greensheets with a paste comprising metallic or ceramic particles;
   optionally filling at least some of the second plurality of vias in at least one of the greensheets with a fugitive material;
   stacking the plurality of greensheets in a predetermined order to form an unsintered multilayer ceramic substrate;
   obtaining a top greensheet and a bottom greensheet;
   punching a plurality of vias in each of the top greensheet and bottom greensheet;
   filling all of said plurality of vias in each of the top greensheet and bottom greensheet with an electrically conducting paste;
   placing the top greensheet on the top of the unsintered multilayer ceramic substrate;
   placing the bottom greensheet on the bottom of the unsintered multilayer ceramic substrate; and
   sintering the top greensheet and bottom greensheet with the unsintered multilayer ceramic substrate, wherein the binder material and optional fugitive material are removed, thereby resulting in a sintered multilayer ceramic substrate.

* * * * *